United States Patent

Engles et al.

[11] Patent Number: 5,867,053
[45] Date of Patent: Feb. 2, 1999

[54] MULTIPLEXED OUTPUT CIRCUIT AND METHOD OF OPERATION THEREOF

[75] Inventors: Bruce E. Engles; Daniel C. Knightly, both of Austin, Tex.

[73] Assignee: Motorola Inc., Austin, Tex.

[21] Appl. No.: 822,969

[22] Filed: Mar. 21, 1997

[51] Int. Cl.⁶ .................................. H01P 9/00; H03F 1/56
[52] U.S. Cl. ........................... 327/407; 327/408; 327/409
[58] Field of Search ...................................... 327/407–413

[56] References Cited

U.S. PATENT DOCUMENTS

| | | | |
|---|---|---|---|
| 4,855,614 | 8/1989 | Maitre | 307/241 |
| 4,959,873 | 9/1990 | Flynn et al. | 455/303 |
| 4,972,157 | 11/1990 | Moyal | 330/51 |
| 5,463,326 | 10/1995 | Raje | 326/30 |

Primary Examiner—Timothy P. Callahan
Assistant Examiner—An T. Luu
Attorney, Agent, or Firm—Craig J. Yudell

[57] ABSTRACT

A multiplexed output circuit (200) for use in an integrated circuit (500) such as a static random access memory locates a plurality of amplifiers (206, 208), a plurality of output buffers (210, 212), and an output driver (201) on the integrated circuit (500), such that the routing parasitic delay between the plurality of output buffers and the output driver (218–224) is greater than the routing parasitic delay between any output buffer (e.g. 212) and its corresponding amplifier (e.g. 206).

17 Claims, 4 Drawing Sheets

*FIG. 1* –PRIOR ART–

MULTIPLEXED OUTPUT CIRCUIT AND METHOD OF OPERATION THEREOF

FIELD OF THE INVENTION

The present invention relates in general to integrated circuits and, more particularly, to integrated circuit output circuits.

BACKGROUND OF THE INVENTION

When creating new generations of memory designs, improvement in speed and reduction in power consumption of the memory are prime considerations. With the adoption of revolutionary pin-out configurations, where the corner power and ground pins have been moved to center positions on both sides of the chip and output pads have been moved from one side of the periphery to both sides, and with the greater density of new generations of memory chips increasing the routing line distance between memory cells and output pins, new design strategies are required to further improve the speed/power product of the memory.

FIG. 1 shows a prior art multiplexed output circuit for a multiple core memory array. Multiplexed output circuit 110 receives a global data line differential signal GDL1 130/GDLB1 131 from a first memory core at amplifier 112. Multiplexed output circuit 110 receives a global data line differential signal GDL2 132/GDLB2 133 from a second memory core at amplifier 114. The differential signals provide a differential input into each amplifier, except when the sending core is deselected. Because multiplexed output circuit 110 reads from two separate cores, ENABLE1 134 and ENABLE2 135 are set to enable either amplifier 112 or amplifier 114, respectively, as each core is addressed and read. Amplifiers 112, 114 are generally located as close as possible to the sense amplifier reading data from a particular memory block. Therefore, a significant RC delay is introduced by the parasitic capacitance of the long routing lines driven by amplifiers 112, 114 to the corresponding output buffer 120. This can be seen in FIG. 1 where RC delays 116–119 represent the parasitic routing delay affecting the amplifier output signals 136–139. The resultant delayed signals DATA 140 and DATAB 141 are received at the output buffer 120, located at the periphery of the chip in proximity to the output driver 122 and data pad 124. Output buffer 120 often includes a rise/fall control 121 to introduce rise time and fall time components in the pullup signals 142 and pulldown signals 143. These additional rise and fall times are introduced into the signals to prevent reflections, noise and glitches in the output driver signal DQ 144.

As will be appreciated, to maintain the speed performance of the output circuit, amplifiers 112 and 114 need increased switching current capability to drive larger parasitic routing components. This requires the amplifier, which is generally a DC current consuming device, to consume additional power to compensate for the increased parasitic routing delay seen for greater density memory arrays. Thus, multiplexed output circuits in the prior art do not provide the best speed-power product for new generations of higher density memory devices utilizing the revolutionary pin-out configurations.

DESCRIPTION OF THE PREFERRED EMBODIMENTS

Figure 1:
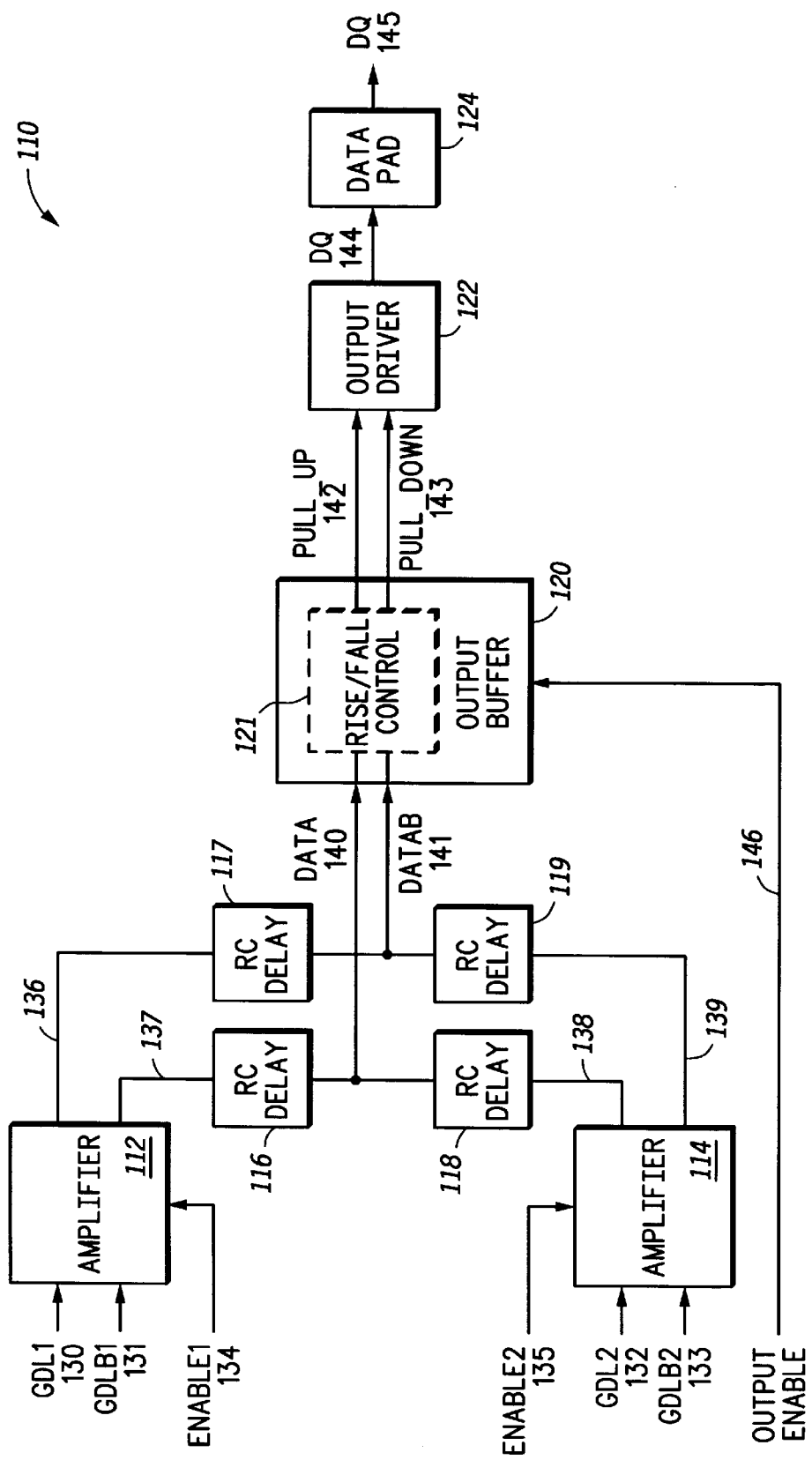
FIG. 1 shows a prior art multiplexed output circuit for a multiple core memory array.
Figure 2:
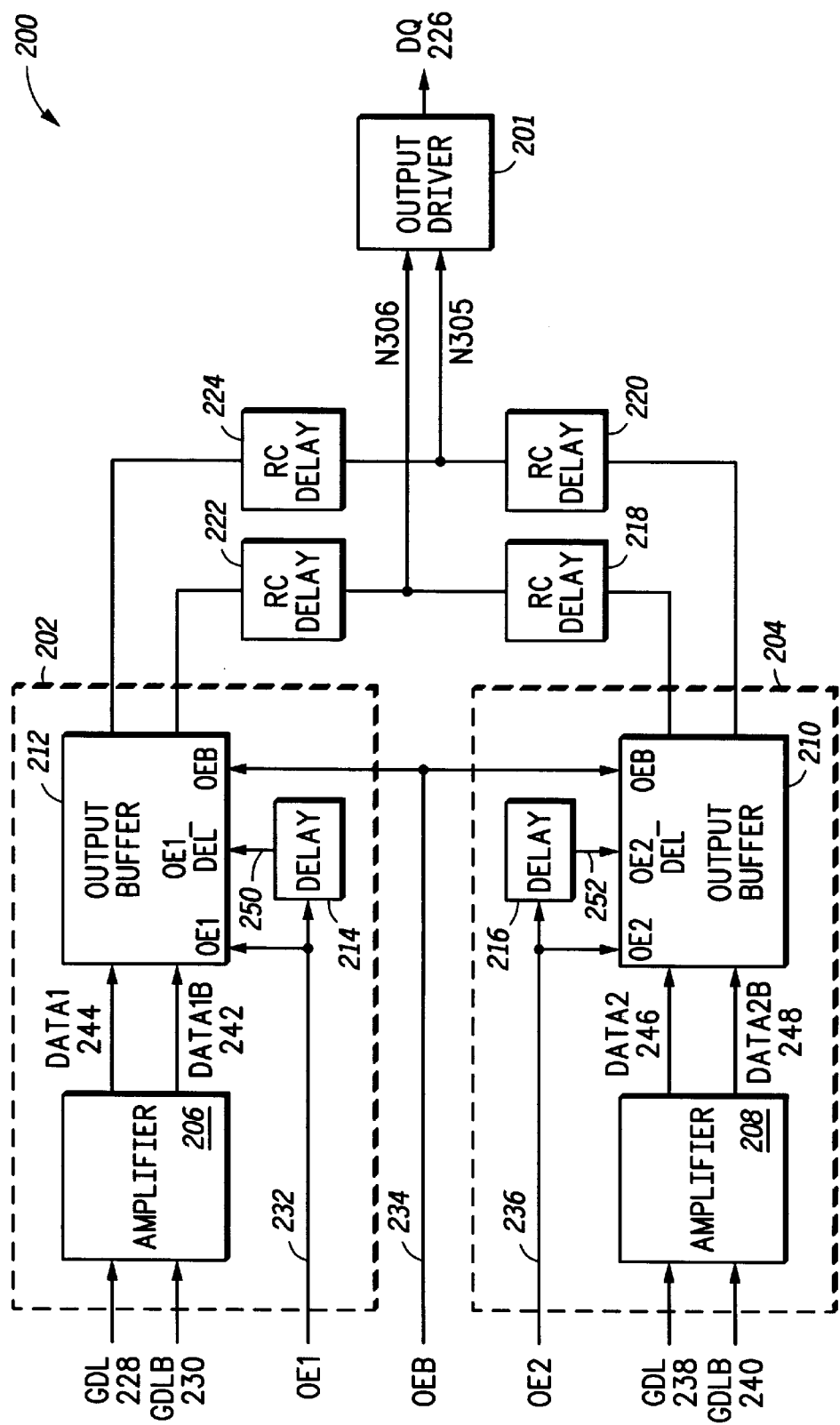
FIG. 2 shows a schematic block diagram of a multiplexed output circuit for a multiple core memory architecture, in accordance with a preferred embodiment of the present invention.

With reference now to FIG. 2, there is shown a schematic block diagram of a multiplexed output circuit for a multiple core memory architecture, in accordance with a preferred embodiment of the present invention. Multiplexed output circuit 200 includes output driver 201, output buffer/amplifier combination 202 and output buffer/amplifier combination 204. Differential amplifier 206 receives the global data line differential signal GDL 228/GDLB 230 from a first memory core, and amplifier 208 receives a second differential input GDL 238/GDLB 240 from a second memory core. Although shown as differential signals, the multiplexed output circuit of the present invention can also be implemented using single-ended signals. Output buffer 212 receives amplified data signals DATA1 244 and DATA1B 242. Similarly, output buffer 210 receives amplified data signals DATA2 246 and DATA2B 248. Output buffer 210 and output buffer 212 generate the buffered outputs that are driven to a common gate of output driver 201. Output buffers 210, 212 are able to drive output signals at nodes N305 and N306 through RC delays 218–224 (representing the routing conductors' impedance) to output driver 201.

The system works as follows: When the OEB signal shared by the two output buffers 210, 212 is high, both output buffers 210, 212 drive N405 and N406 with a logic low, causing the output driver 201 to tristate. When OEB is low, enabling the output, OE1 and OE2 determine which output buffer drives the N406 and N506 lines controlling the output driver 201 and which output buffer is tristated. OE1 and OE2 are formed by combining the OEB signal with the Address/Address-Bar signal controlling which datapath is active.

The timing of the OE1 and OE2 lines have been designed such that the first buffer deselects before the second buffer selects. This ensures that bus contention does not occur on signal lines N405 and N406. During the short time when both OE1 and OE2 are low, tristating both output buffers 210, 212, a latch in the output driver 201 circuit holds the data. The OE1 or OE2 rising signal is delayed so as not to turn the output buffer on before the DATA/DATAB signals are driven with the correct data from the amplifier 206. If the output buffer turns on too soon, the DATA/DATAB are still low, and N405/N406 will be driven low until the DATA/DATAB develop the correct data. This causes the output driver 201 to tristate until the actual data is ready. Delaying the output buffer selection eliminates this problem.

Multiplexed output circuit 200 provides multiplexing of two outputs of two separate memory arrays of a multiple core memory array to a single output driver and data pad. In alternative embodiments of the present invention, additional (N-2) amplifier/output buffer combinations could be placed in parallel with combinations 202 and 204 at the inputs N305, N306 of the output driver 201 to provide a Nth order multiplexed output from the multiple core memory array. This would require additional (N-2) control lines in parallel with control lines OE1 232 and OE2 236.

As can be seen, an output buffer has been placed in close proximity of each amplifier, allowing each output buffer to drive the signal across the large parasitic routing between the amplifier/output buffer 202, 204 and associated output driver 201, instead of the amplifiers driving the lines as was seen in the prior art. Having an output buffer at each amplifier allows the amplifiers to be buffered before the large routing parasitic delays 218–224 are driven. As will be appreciated, this substantially reduces the required driving capability of amplifiers 206, 208 because the proximity of the output buffers makes the routing parasitic delay between the amplifier and the output buffer at least an order of magnitude less than the routing parasitic delays 218–224. Further, because output buffers 210, 212 are designed as full-rail CMOS buffers, they can be increased in size to enhance their driving capability with zero increase of DC power consumption, avoiding the increased DC power consumption required in the prior art.

An additional advantage of the preferred embodiment is that output driver inputs are preferably controlled to optimize the rise and fall time of the input signals such that excessive switching noise at the output of output driver 201 is eliminated. However, because in the preferred embodiment the output buffers 210, 212 are already driving on parasitic routing lines N305, N306, the signal received by the output driver 201 are inherently delayed, decreasing dV/dt at the output driver inputs N305 and N306. Consequently, the rise/fall control normally required in output buffers of the prior art is inherent in the design of the present invention. Thus, the routing lines 218–224 serve both the purpose of routing the signals from output buffers 210, 212 to output driver 201 and introducing the switching delay for the desired rise/fall control. As will further be appreciated, the elimination of rise/fall delay at inopportune places in the signal path increases the speed of the memory array of the present invention.

As will be appreciated by those skilled in the art, the multiplexed output circuit of the present invention can be can be utilized in any circuit or system that has a plurality of outputs that can be multiplexed such as a multiple core memory architecture. For example, the multiplexed output of the present invention could be part of a microcontroller output circuit. Further, the multiplexed output circuit of the present invention can be used to drive a data signal external to an integrated circuit containing the multiplexed output circuit.

Figure 3:
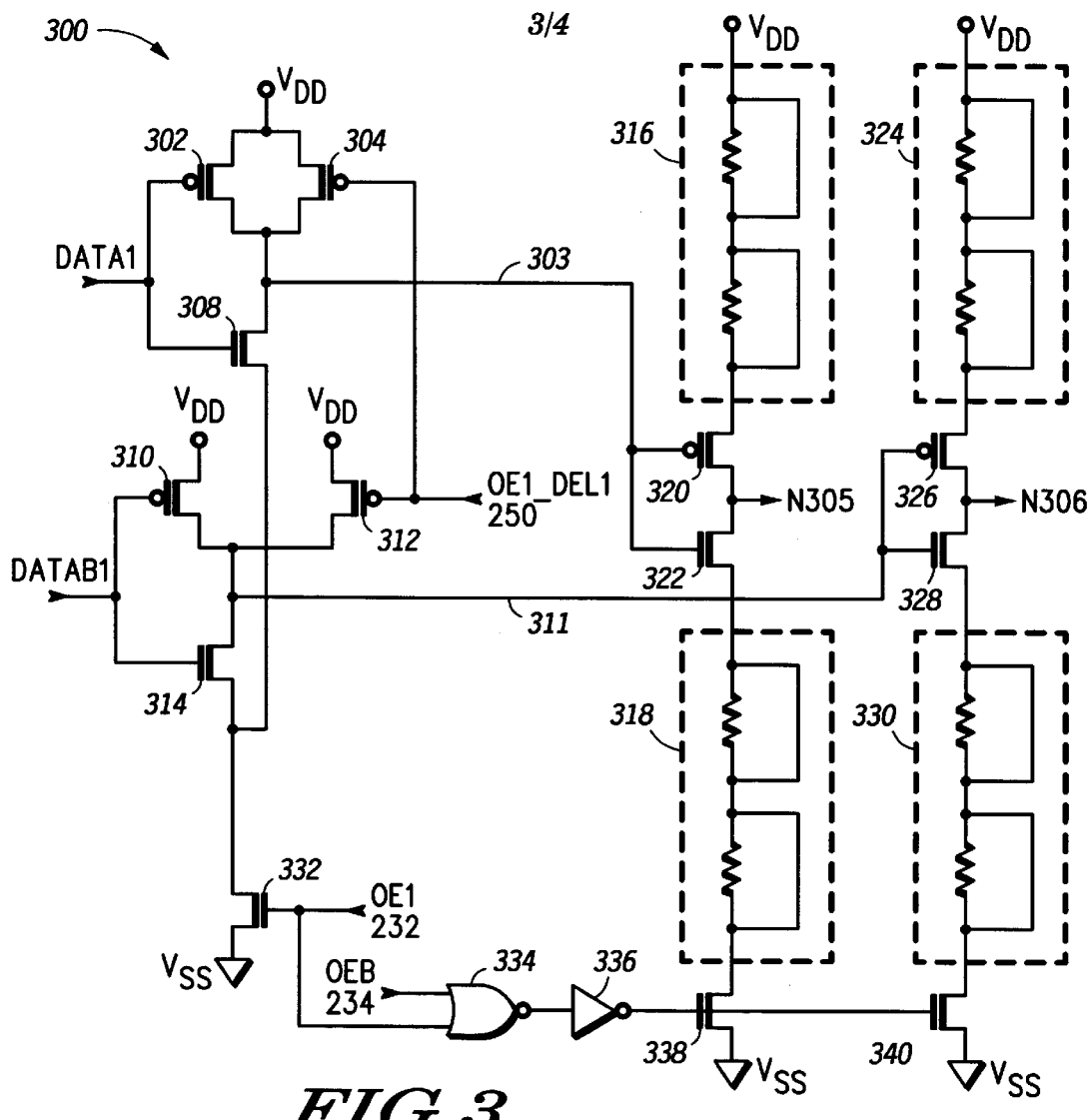
FIG. 3 shows an output buffer for the multiplexed output circuit, in accordance with the preferred embodiment of the present invention.

With reference now to FIG. 3, there is shown an output buffer 300 for the multiplexed output circuit, in accordance with the preferred embodiment of the present invention. Output buffer 300 is a schematic diagram of a preferred embodiment of output buffers 210 and 212 shown in FIG. 2. Output buffer 300 has three possible functions determined by the state of its three control lines: OE1 232, OE1 DEL1 250, and OEB 234. These functions are: 1) to allow the buffer to pass data to nodes N305 and N306, 2) tristate the buffer, and 3) drive nodes N305 and N306 to tristate the output driver 201. These functions will be described below. Note that OE1DEL1 250 is a delayed version of OE1 232. OE1 232 and OE1DEL1 250 correspond to a particular output buffer 300 while OEB 234 goes to all the output buffers of the memory.

The output buffer 300 performs the first function when OEB 234 is set low and OE1 232 and OE1DEL1 are set high. In this state, NMOS transistors 332, 338 and 340 will be turned on, and PMOS transistors 304 and 312 will be turned off. PMOS transistor 302 and NMOS transistor 308 receive DATA1, and act as an inverting buffer that drives line 303 to PMOS transistor 320 and NMOS transistor 322. Similarly, transistors 310, 314 receive signal DATA1B and drive the inverted signal on line 311 to transistors 326, 328 to produce the output N306.

Output buffer 300 performs the second function (tristating output nodes N305, N306) when OEB 234, OE1 232 and OE1DEL1 250 are all low. OE1 232 connects to NOR gate 334 and NMOS transistor 332. The second enable signal, OE1DEL1 250 is a delayed version of OE1 232. OE1 DEL1 250 is connected to the gate of transistors 312 and 304. OE1 232 set low turns off transistor 332 and transistors 338, 340 through NOR gate 334 and inverter 336. When output enable signal OE1DEL1 250 is set low, transistors 304 and 312 are turned on, driving lines 303 and 311 high, turning off transistors 320, 326. This effectively places output buffer 300 in tristate (high impedance state). Because of the insertion delay created by gates 334 and 336, the deselect signal at the gate of transistors 312 and 304 is delayed by two gate delays, which prevents signals on lines 303 and 311 from being driven logically high before transistors 338 and 340 have turned off. This prevents glitches on nodes N305 and N306 of the buffers.

Output buffer 300 performs its third function, to place the output driver in tristate, when OEB 234 is set high and OE1 232 and OE1DEL250 are set low. OEB 234 is a global chip select signal received by all output buffers of the memory to control by NOR 334 and inverter 336 with OE1 232 to control transistors 338, 340. When OEB 234 is set high, transistors 338 and 340 are turned on, and the OE1 232 enable signal of each output buffer will be low. In turn OE1 DEL 250 will be set low, turning on transistors 304 and 312 and pulling N303 and N311 high. This will turn on transistors 322, 328 and turn off transistors 320, 326, driving outputs N305, N306 to $V_{SS}$ which will tristate output driver 201.

Resistors 316 provide optional impedance between the supply $V_{DD}$ and transistor 320. Similarly, resistors 318 provide a optional impedance between transistor 322 and supply voltage $V_{SS}$, through transistor 338. Resistors 324 and resistors 330 provide selectable impedance between transistors 326, 328 and the supply voltages. As will be appreciated, optionable impedances 316, 318, 324, 330 provide the option of adding additional rise/fall control at the output buffer drivers to further customize the rise and fall time of the driven signal.

Figure 4:
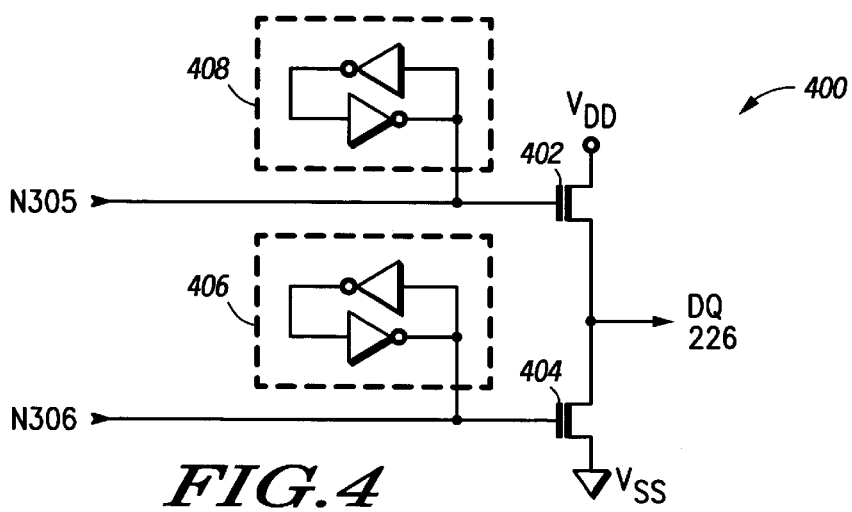
FIG. 4 illustrates an output driver for the multiplexed output circuit.

With reference now to FIG. 4, there is shown an output driver 400, which can be used as output driver 201 in multiplexed output circuit 200. Output driver 400 includes NMOS transistors 402, 404 for performing a pull-up/pull-down function for the output signals N305, N306 connected to the gates of transistors 402, 404, respectively. Latches 406, 408 maintain the signal N305, N306 on the gates of transistors 402, 404 during periods of tristate when the routing parasitic line is not being driven by one of the multiple output buffers.

Figure 5:
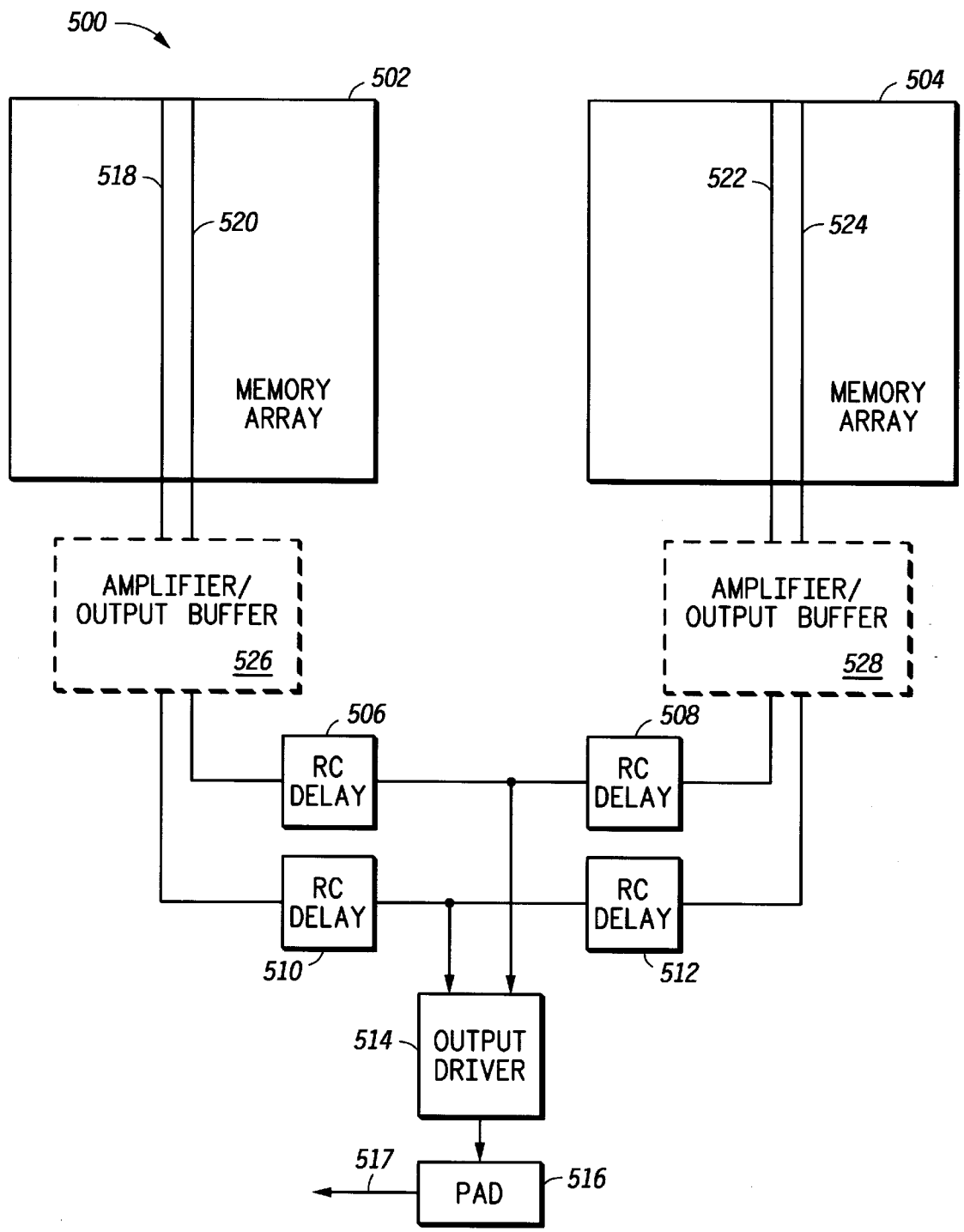
FIG. 5 illustrates a multiple core memory architecture using multiplexed output circuits, in accordance with a preferred embodiment of the present invention.

With reference now to FIG. 5, there is shown a multiple core memory architecture using multiplexed output circuits, in accordance with a preferred embodiment of the present invention. Memory 500, for example a static random access memory (SRAM), includes memory arrays 502, 504 providing data outputs on input global data lines 518–524 at amplifier/output buffers 526, 528, which are configured substantially as amplifier/output buffers 202, 204 shown in FIG. 2. It will be appreciated that in an alternative embodiment a microcontroller 500 includes memory devices and/or execution units 502, 504 that provide data outputs on data lines 518–524.

In operation, a block from memory array 502 or memory array 504 is selected to read data bits out of each block onto the global data lines and into amplifier/output buffers 526, 528. Depending upon the memory array selected, the corresponding output buffer is selected in each multiplexed output circuit. For example, if data is read from memory array 502, signal OE1 (seen in FIG. 2) is asserted to enable amplifier/output buffer 526. Similarly, if data is being read from memory array 504, an enable signal is asserted to enable amplifier/output buffer 528. In this way, the data being read is output to the appropriate output buffer and driven to output driver 514 to be output at pad 516 as external signal 517. External signal 517 is a data signal transmitted external to the integrated circuit.

As will be appreciated, additional multiplexed output circuits not shown would be included in memory 500 to provide the additional outputs needed for a Nth order memory. Also, as will be appreciated by those skilled in the art, the size of the memory array or layout of output buffers for certain applications may require the multiplexing of additional global data lines to a single output driver. Thus, memory array 500 would further include additional amplifier/output buffer combinations (not shown) connected in parallel with amplifier/output buffers 526, 528.

As will now be appreciated, the present invention provides a multiplexed output circuit where each amplifier has an output buffer placed in close proximity which may efficiently drive a signal across the large parasitic routing between the amplifier/output buffer and associated output driver, instead of the amplifiers driving the routing lines as was seen in the prior art. This substantially reduces the driving capacity required of amplifiers because of the proximity of the output buffers, allowing a substantial reduction in component size and DC power consumption of the amplifier power circuits. Further, because output buffers are designed as full-rail CMOS buffers, they can be designed to drive the data lines with zero DC consumption, avoiding the increased DC power consumption required in the prior art.

An additional advantage of the preferred embodiment is that output driver inputs are preferably controlled to optimize the rise and fall time of the input signals such that excessive switching noise at the pad is eliminated. Consequently, the rise/fall control normally required in output buffers of the prior art is replaced in the present invention by the design of the amplifier/output buffer, global routing insertion delay, and output driver/pad components.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A multiplexed output circuit, comprising:
   a first amplifier having a input and having an output;
   a first output buffer having an input and having an output;
   a first routing conductor, coupled to the output of said first amplifier and coupled to the input of said first output buffer, said first routing conductor having a first routing parasitic delay;
   a second amplifier having a input and having an output;
   a second output buffer having an input and having an output;
   a second routing conductor, coupled to the output of said second amplifier and coupled to the input of said second output buffer, said second routing conductor having a second routing parasitic delay;
   an output driver having an input and having an output; and
   a third routing conductor, for coupling the output of said first output buffer and the output of said second output buffer to the input of said output driver, said third routing conductor having a third routing parasitic delay wherein the third routing parasitic delay is greater than the first routing parasitic delay and the third routing parasitic delay is greater than the second routing parasitic delay.

2. The multiplexed output circuit of claim 1, wherein the third routing parasitic delay is at least an order of magnitude greater than the first routing parasitic delay and the third routing parasitic delay is at least an order of magnitude greater than the second routing parasitic delay.

3. The multiplexed output circuit of claim 1, wherein the multiplexed output circuit is used to drive a data signal external to an integrated circuit.

4. The multiplexed output circuit of claim 3, wherein the integrated circuit is a microcontroller.

5. The multiplexed output circuit of claim 3, wherein the integrated circuit is a memory.

6. The multiplexed output circuit of claim 5, wherein the memory is a static random access memory (SRAM).

7. The multiplexed output circuit of claim 1, wherein said first output buffer comprises:
   a first control input for receiving a first buffer select signal; and
   a circuit portion for selecting said first output buffer to provide data from the input of said first output buffer to said output driver in response to the first buffer select signal;
   and wherein said second output buffer comprises:
   a first control input for receiving a second buffer select signal; and
   a circuit portion for selecting said second output buffer to provide data from the input of said second output buffer to said output driver in response to the second buffer select signal.

8. The multiplexed output circuit of claim 1, wherein the output driver has a high impedance state.

9. The multiplexed output circuit of claim 8, wherein said first output buffer comprises:
   a first control input for receiving a first buffer select signal;
   a second control input for receiving an output enable signal;
   a first circuit portion for selecting said first output buffer to provide data from the input of said first output buffer to said output driver in response to the first buffer select signal; and
   a second circuit portion for causing the output driver to go to the high impedance state in response to the output enable signal;
   and wherein said second output buffer comprises:
   a first control input for receiving a second buffer select signal;
   a second control input for receiving the output enable signal;
   a first circuit portion for selecting said second output buffer to provide data from the input of said second output buffer to said output driver in response to the second buffer select signal; and
   a second circuit portion for causing the output driver to go to the high impedance state in response to the output enable signal.

10. A method for providing a multiplexed output circuit, comprising the steps of:

provoding a plurality of amplifiers;

providing a plurality of output buffers, wherein each one of the plurality of output buffers is coupled to a corresponding one of the plurality of amplifiers by a routing conductor, wherein each routing conductor has a routing parasitic delay less than a predetermined value;

providing an output driver coupled to each one of the plurality of output buffers; and locating the plurality of amplifiers, the plurality of output buffers, and the output driver on an integrated circuit such that a routing parasitic delay between the plurality of output buffers and the output driver is greater than the predetermined value.

11. The method of claim 10, further comprising the step of:

selecting one of the plurality of output buffers to provide a data signal to the output driver.

12. The method of claim 10, wherein the output driver has a high impedance state.

13. The method of claim 12, further comprising the steps of:

determining whether to place the output driver in the high impedance state; and if the output driver is not in the high impedance state, selecting at least one of the plurality of output buffers to provide a data signal to the output driver.

14. The method of claim 10, wherein the multiplexed output circuit is used to drive a data signal external to an integrated circuit.

15. The method of claim 14, wherein the integrated circuit is a microcontroller.

16. The method of claim 14, wherein the integrated circuit is a memory.

17. The method of claim 16, wherein the memory is a static random access memory (SRAM).

* * * * *